US007304711B2

(12) United States Patent
Takeguchi et al.

(10) Patent No.: US 7,304,711 B2
(45) Date of Patent: Dec. 4, 2007

(54) LIQUID CRYSTAL DISPLAY AND METHOD OF MANUFACTURING THE SAME

(75) Inventors: Toru Takeguchi, Tokyo (JP); Takeshi Kubota, Kumamoto (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 329 days.

(21) Appl. No.: 11/187,238

(22) Filed: Jul. 22, 2005

(65) Prior Publication Data

US 2006/0028606 A1 Feb. 9, 2006

(30) Foreign Application Priority Data

Aug. 6, 2004 (JP) .............................. 2004-230824

(51) Int. Cl.
*G02F 1/1345* (2006.01)
(52) U.S. Cl. ...................................... 349/152; 349/149
(58) Field of Classification Search ......... 349/149–152
See application file for complete search history.

(56) References Cited

U.S. PATENT DOCUMENTS 5,187,604 A * 2/1993 Taniguchi et al. .......... 349/152
6,226,060 B1 * 5/2001 Onisawa et al. .............. 349/43
6,259,495 B1 * 7/2001 Maeda ......................... 349/42
6,989,881 B2 * 1/2006 Kawamura et al. ......... 349/149
7,098,985 B2 * 8/2006 Ishida ......................... 349/152

FOREIGN PATENT DOCUMENTS

| JP | 61-130927 | 6/1986 |
| JP | 2000-155335 | 6/2000 |
| JP | 2001-093598 | 4/2001 |

* cited by examiner

*Primary Examiner*—David Nelms
*Assistant Examiner*—John Heyman
(74) *Attorney, Agent, or Firm*—Buchanan Ingersoll & Rooney PC

(57) ABSTRACT

A method of manufacturing a liquid crystal display holding a liquid crystal layer between a picture element substrate on which a pixel electrode driven by a thin film transistor is formed and a opposed counter substrate and forming a terminal to an external driving circuit on the picture element substrate, includes forming a semiconductor layer on the substrate, forming a gate insulating film on the semiconductor layer, forming a gate electrode on the gate insulating film, forming a source-drain region in the semiconductor layer, forming a source-drain wire on the substrate, forming a terminal wire on the substrate, forming insulating inorganic films on regions of the terminal wire on the external driving circuit and a display area sides, forming an organic resin film on the insulating inorganic film, and forming a conductive film on the terminal wire. The conductive film has a predetermined distance to the organic resin film.

10 Claims, 5 Drawing Sheets

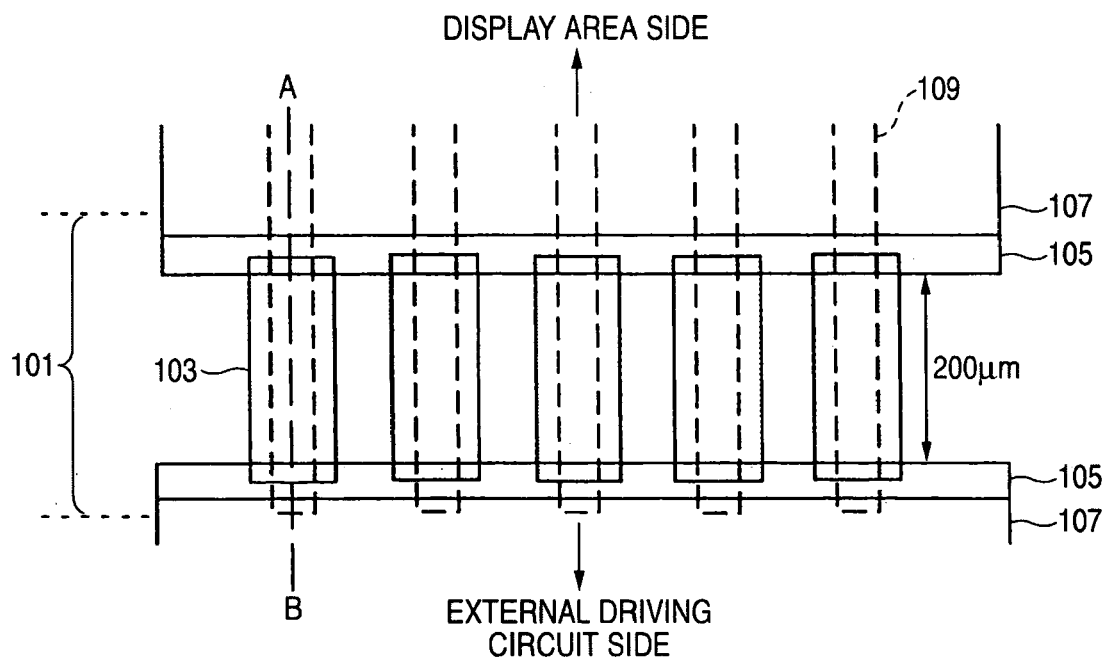
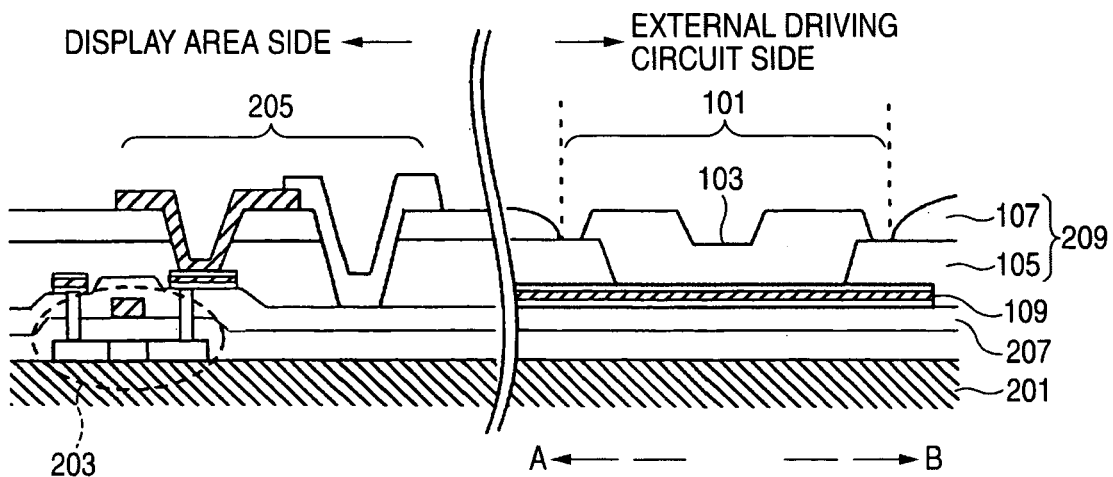

LIQUID CRYSTAL DISPLAY AND METHOD OF MANUFACTURING THE SAME

BACKGROUND OF THE INVENTION

1. Field of the Invention

The present invention relates to a liquid crystal display provided with a terminal to be connected to an external driving circuit, and a method of manufacturing the same.

2. Description of the Related Art

The liquid crystal display is formed so that an insulating substrate provided thereon with a thin film transistor, a pixel electrode, a wire, a terminal to be connected to an external driving circuit, and the like, and an insulating substrate provided thereon with a color filter, a counter electrode and the like are disposed in an opposed state with a liquid crystal held therebetween.

The wire is formed out of a metal, such as Al, Cr, Mo and the like. The terminal to be connected to an external driving circuit is formed so that an electrode surface formed out of Cr and Mo is covered with a transparent conductive oxide film, such as an indium tin oxide (ITO) film and an indium zinc oxide (IZO) film.

To connect the external driving circuit and terminal together, anisotropic conductive particles are used. (See, e.g., JP-A-2000-155335 (page 6, FIG. 2).)

In the above-described liquid crystal display, the surface of the terminal to be connected to an external driving circuit is exposed, and in an atmospheric moisture-exposed state. Since the terminal surface is made of a conductive oxide film, the surface is rarely oxidized anymore in the atmospheric air, so that the connecting of the terminal to an external driving circuit can be done stably. However, since ITO and IZO are oxides, they are very active, and readily turn into cathodes in an oxidation-reduction reaction. For example, when the humidity is high with the water in the atmospheric air deposited on the surface of the terminal, a cell reaction is liable to occur between the terminal and Cr or Mo electrode which constitutes a lower layer electrode of ITO and IZO.

SUMMARY OF THE INVENTION

The present invention has been made with a view to solving the above-mentioned problems, and provides a liquid crystal display capable of reducing the occurrence of the breaking of wire (electrolytic corrosion) which is ascribed to a cell reaction of a terminal to be connected to an external driving circuit, and having a terminal structure excellent in contact characteristics of a terminal portion, and a manufacturing method therefor.

According to an aspect of the present invention, a method of manufacturing a liquid crystal display, which holds a liquid crystal layer between a picture element substrate on which a pixel electrode driven by a thin film transistor is formed and a counter substrate opposed to the picture element substrate, and which forms a terminal to be connected to an external driving circuit on at least one side of the picture element substrate, the method including forming a semiconductor layer on the substrate, forming a gate insulating film on the semiconductor layer, forming a gate electrode on the gate insulating film, forming a source-drain region by an ion-injecting impurity into the semiconductor layer, forming a source-drain wire on the substrate, forming a terminal wire on the substrate, forming insulating inorganic films on a region of the terminal wire on a side of the external driving circuit and on a region thereof on a side of a display area, forming an organic resin film on the insulating inorganic film, and forming a conductive film on the terminal wire including at least a part of the insulating inorganic film. Preferably, the conductive film has a predetermined distance to the organic resin film.

According to the present invention, an end portion on the side of a display panel of the terminal of the substrate and an end portion on the side of an external driving circuit of the terminal thereof are covered with an insulating protective film. The portion not covered with the protective film of an upper surface of the terminal has a transparent conductive film so that an exposed area of the terminal is reduced to a minimum level, the terminal being thereby rendered difficult to be exposed to the atmospheric air. This enables the terminal to be rendered difficult to receive the influence of the contamination of impurities, etc. It also becomes possible to hold down the occurrence of a cell reaction due to the water contained in the atmospheric air. Since the transparent conductive film on the terminal is not in contact with the organic resin film of a high hygroscopicity constituting a protective film, the occurrence of a cell reaction due to the water contained in the organic resin film can also be held down. Therefore, imperfect electric contact of the terminal portion due to electrolytic corrosion thereof, and the breaking of wire in the terminal portion can be reduced.

BRIEF DESCRIPTION OF THE DRAWINGS

FIG. 1 is a top view showing the terminal structure in the liquid crystal display in the first embodiment of the present invention;

FIG. 2 is a sectional view showing the terminal structure in the liquid crystal display in the first embodiment of the present invention;

DETAILED DESCRIPTION OF THE INVENTION

First Embodiment

Figure 3A:
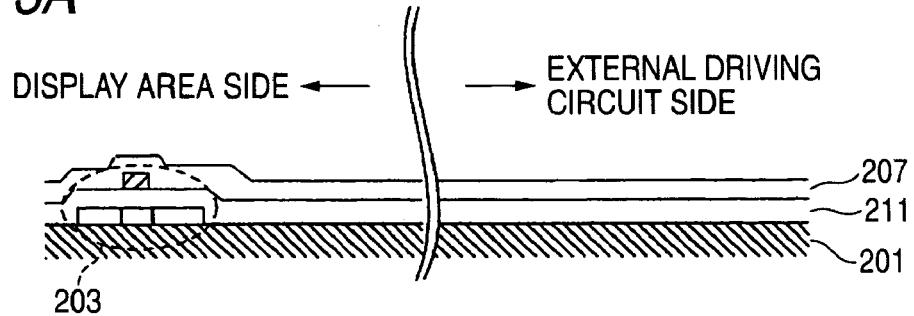
FIGS. 3A to 3C are schematic diagrams showing a flow of the manufacturing of the liquid crystal display in the first embodiment of the present invention.

FIG. 1 is a top view of a liquid crystal display of the first embodiment according to the present invention. FIG. 2 is a sectional view taken along the broken line A-B in FIG. 1, and a sectional view of a region in a display area. Referring to the explanatory drawing used for each embodiment which will be described below, the same reference numerals and letters are added to the same or corresponding portions to omit the description thereof.

Referring to FIGS. 1 and 2, the liquid crystal display in this embodiment has a picture element transistor 203 formed on a glass substrate 201, a pixel electrode 205 driven by the picture element transistor 203, a signal wire 109, an interlayer insulating film 207, a protective film 209 made of an insulating inorganic film 105 and an organic resin film 107, and a terminal 101 for being connected to an external driving circuit. The terminal 101 is made of the signal wire 109 in which Cr/Al/Cr films are laminated and a transparent conductive film 103 made of an ITO film.

A flow of the manufacturing of the liquid crystal display in the mode of this embodiment will be described. Referring to FIG. 3A, a silicon layer is formed on the glass substrate 201 to form a gate insulating film 211. A gate electrode is then formed, and a source-drain region thereafter to form the picture element transistor 203. After the picture element transistor 203 is formed, the interlayer insulating film 207 is laminated thereon.

Figure 3B:
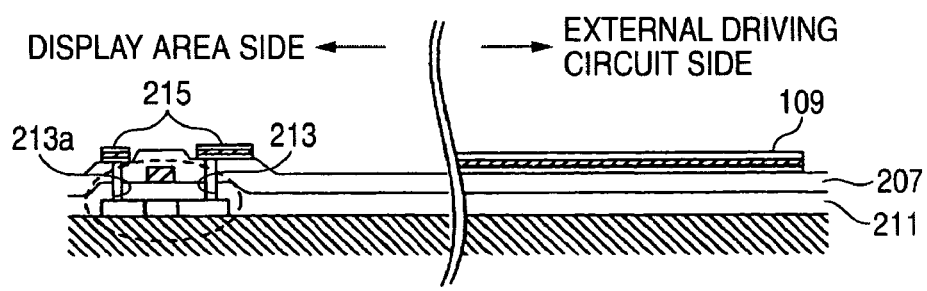

Referring to FIG. 3B, first openings 213a, 213b are formed in the interlayer film 207 and gate insulating film 211 on the source-drain region of the picture element transistor 203, and then source-drain wires 215 on the source-drain region. Simultaneously with the formation of the source-drain wires 215, a signal wire 109 on the side of the external driving circuit. The source-drain wires 215 and signal wire 109 constitute a laminated structure of Cr/Al/Cr.

Figure 3C:
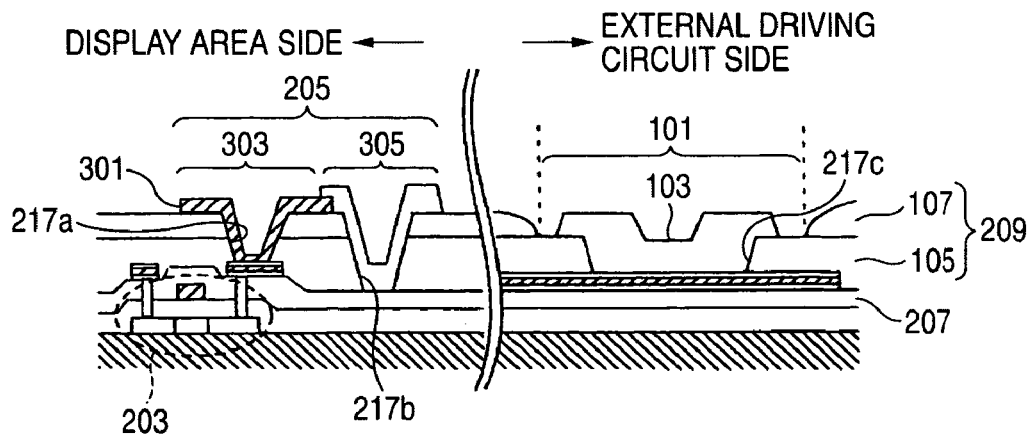

Referring to FIG. 3C, the insulating inorganic film 105 is formed on the interlayer insulating film 207 including the source-drain wire 215 and signal wire 109. The organic resin layer 107 is formed on the insulating inorganic film 105 to form the protective film 209. In the protective film 209, second to fourth openings 217a, 217b, 217c are made by a photoengraving process, and an Al film is then formed to obtain a reflector 303 made of an Al film 301 on a surface of the second opening 217a. An ITO film is then formed, and thereafter a transmission electrode 305 made of an ITO film on a surface of the third opening 217b by a photoengraving process to obtain a pixel electrode 205. On a surface of the fourth opening 217c, a transparent conductive film 103 made of an ITO film is formed on a surface of the fourth opening 217c to obtain the terminal 101. Both end portions of the terminal 101, i.e. the end portions on the side of a display area and on the side of the external driving circuit are covered with the protective film 209 formed by laminating the organic resin film 107 on the insulating inorganic film 105. The organic resin film 107 on the insulating inorganic film 105 is in a retreated state with respect to an end portion thereof. This structure can be obtained by dry etching the insulating inorganic film 105 with the patterned organic resin film 107 used as a mask, and then exposing the resultant product to an oxygen atmosphere plasma, or also by carrying out a photoengraving process two times. Thus, in the terminal 101, a region in which the fourth opening 217c is formed in the insulating inorganic film 105 on the signal wire 109 and its circumferential insulating inorganic film 105 are covered with the ITO film constituting the transparent conductive film 103, and the ITO film is not in contact with the organic resin film 107 on the insulating inorganic film 105. A distance between the portions of the insulating inorganic film 105 which cover the signal wire 109 is set in this embodiment to 200 μm. This distance may be set to a required minimum level for obtaining an electrical contact with the external driving circuit, and not necessarily set to 200 μm.

The insulating inorganic film 105 and organic resin film 107 which form the protective film 209 are made of a silicon nitride film constituting a passivation film used in the manufacturing of the display area and an acrylic organic resin film used for forming the irregular surface of the reflecting plate or for improving the numerical aperture. Therefore, a new step may not be added, and the productivity is not lowered. The signal wire 109 constituting the terminal 101 is made of the film in the layer identical with that of the source-drain wire 215 of the picture element transistor 203 formed in the display area. Therefore, a new step may not be added, and the productivity is not lowered.

According to the present invention in the first embodiment described above, the signal wire 109 constituting the terminal 101 is not exposed to the atmospheric air, and the ITO film on the signal wire 109 prevents the terminal from contacting the acrylic organic resin film 107 of a high hygroscopicity, so that it is difficult to receive the influence of contamination of impurities, etc. It is also possible to hold down the occurrence of an electrolytic corrosion reaction ascribed to the water contained in the atmospheric air and acrylic organic resin film 107. This enables the occurrence of imperfect contact of the terminal due to electrolytic corrosion, and the breaking of wire in the terminal to be lowered.

Second Embodiment

In the first embodiment, the ITO film formed in the step identical with that in which the source-drain wire 215 is formed, via the fourth opening 217c made in the insulating inorganic film 105, and formed on the signal wire 109 made of laminated films or Cr/Al/Cr which is made of a layer identical with that of the source-drain wire 215, is provided so that the ITO film does not contact the organic resin film 107. On the other hand, a Cr film is formed on the lower side of the ITO film of the terminal 101 in this embodiment.

Figure 4:
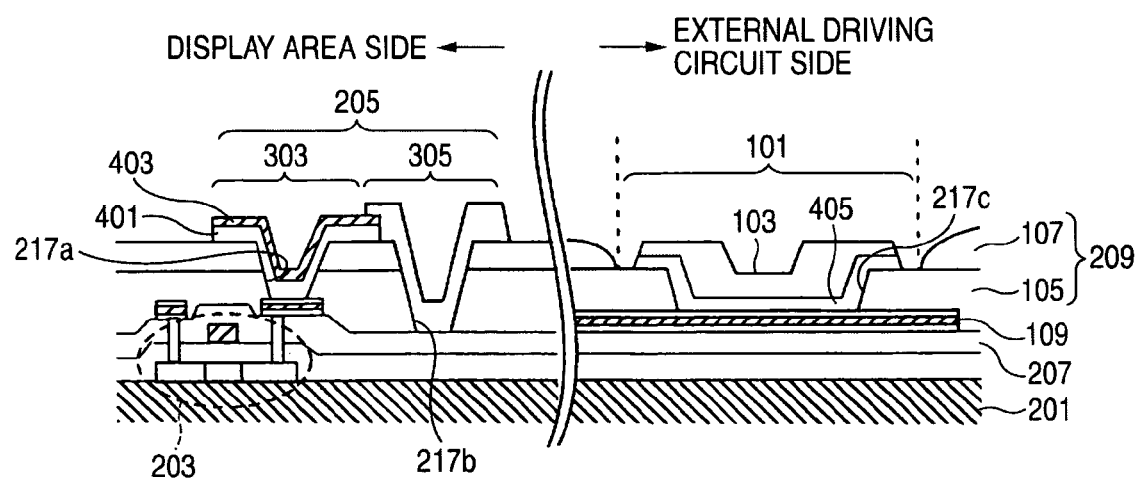
FIG. 4 is a sectional view showing the terminal structure in the liquid crystal display in the second embodiment of the present invention.

FIG. 4 is a sectional view of the liquid crystal display in the second embodiment.

Referring to FIG. 4, a flow of the manufacturing of the liquid crystal display in this embodiment will be described. Second to fourth openings 217a, 217b, 217c are formed in the same manner as in the first embodiment in a protective layer 209 on an interlayer insulating film 207 including a source-drain wire 215 and a signal wire 109, by a photo engraving process. A laminated Al/Cr film is then formed, and thereafter an Al film of a reflector 303, which constitutes a pixel electrode 205, by a photoengraving process. The Cr film in a region of a transmission electrode 305 which forms the pixel electrode 205 by the photoengraving process is then removed, and a transparent conductive film made of ITO film is thereafter formed. An ITO film of the transmission electrode 305, and a laminate of an ITO film and a Cr film 405 of a terminal 101 are then formed. Thus, the reflector 303 made of a laminate of a Cr film 401 and an Al film 403 is formed on a surface of the second opening 217a, and the transmission film 305 made of an ITO film on an upper surface of the fourth opening 217b, to form the pixel electrode 205. An electrode made of an ITO film and a Cr film 405 and constituting the transparent conductive film 103 is formed on a surface of the fourth opening 217c, to obtain a terminal 101. Both ends, i.e. a display area side end and an external driving circuit side end of the terminal 101 are covered with a protective film 209 formed by laminating an organic resin film 107 on an insulating inorganic film 105. The organic resin film 107 on the insulating inorganic film 105 is in a retreated state with respect to an end portion of the insulating inorganic film 105 in the same manner as in the first embodiment. Thus, in the terminal 101, a region in which the fourth opening 217c is formed in the insulating inorganic film 105 on the signal wire 109, and the portion of the insulating inorganic film 105 which surrounds this region are covered with the ITO film constituting the transparent conductive film 103, and the ITO film is formed so that the ITO film does not contact the organic resin film 107 on the insulating inorganic film 105.

Even in the second embodiment, the insulating inorganic film 105 and organic resin film 107 which form the protective film 209 for obtaining the protective film 209 in the same manner as in the first embodiment are made of the same silicon nitride film, i.e. the same passivation film as was used for the manufacturing of the display area, or the same acrylic organic resin film as was used for forming an irregular surface of the reflecting plate or improving the numerical aperture thereof. Therefore, a new step may not be added, and the productivity is not lowered. Moreover, since the signal wire 109 forming the terminal 101 is made of a film in the layer identical with that of the source-drain wire 213 for the picture element transistor 203 formed in the display area, a new step may not be added, and the productivity is not lowered.

According to the invention in the second embodiment described above, the signal wire 109 constituting the terminal 101 is not exposed to the atmospheric air, and the ITO film on the signal wire 109 avoids contacting the acrylic organic resin film 107 of a high hygroscopicity. Therefore, this embodiment rarely receives the influence of the contamination of impurities, etc. It is also possible to hold down the occurrence of an electrolytic corrosion reaction ascribed to the water contained in the atmospheric air and the water contained in the acrylic organic resin film 107. Therefore, the imperfect electric contact of the terminal portion due to the electrolytic corrosion and, moreover, the breaking of wire in the terminal portion can be minimized. The ITO film constituting the terminal 101 is formed via the Cr film 405 in a lower layer, and a distance between the ITO film and the Al used for the signal wire 109 can be set large, so that the corrosion resistance of the ITO film is improved.

Third embodiment

In the first and second embodiments, the ITO film was formed on the source-drain wire 215 via the fourth opening 217c formed in the insulating inorganic film 105, in the step identical with that for forming the source-drain wire 215, on the Cr/Al/Cr wire so as not to contact the organic resin film 107, on the Cr/Al/Cr wire, which was a film of the layer identical with the source-drain wire 215. On the other hand, the mode of this embodiment is formed so that a signal from an external driving circuit is inputted into a display panel by utilizing a Cr electrode wire formed in the same layer as a gate wire.

Figure 5:
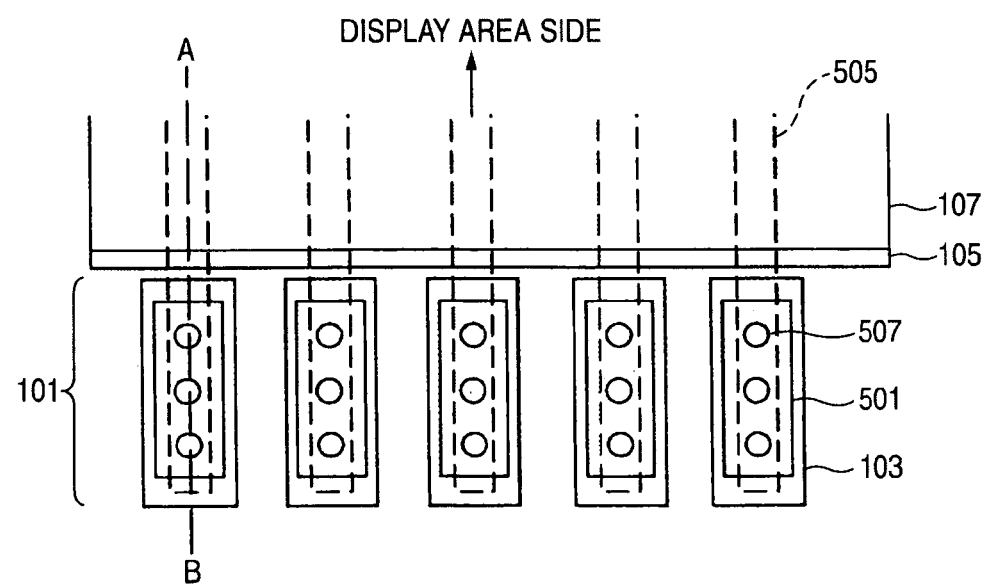
FIG. 5 is a top view showing the terminal structure in the liquid crystal display in the third embodiment of the present invention.
Figure 6:
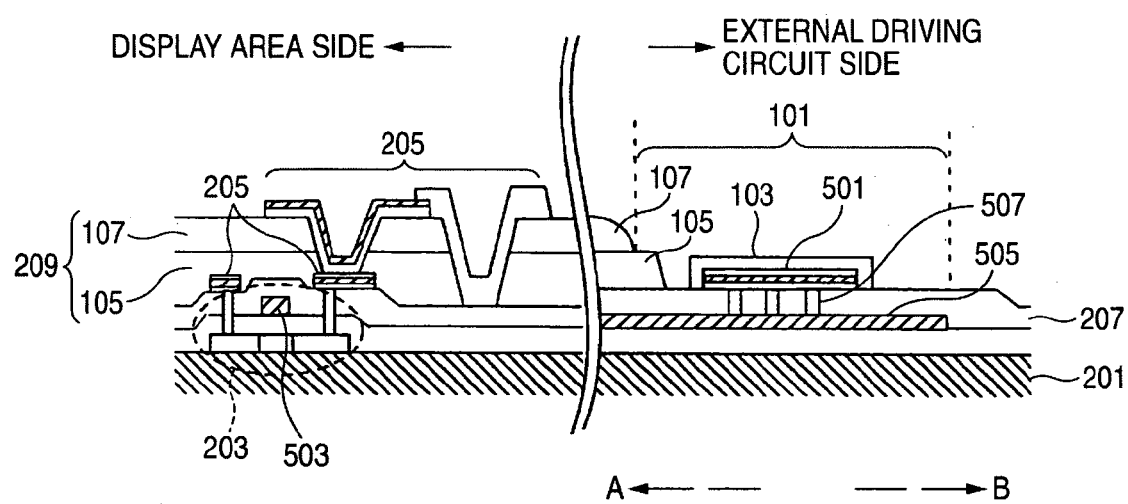
FIG. 6 is a sectional view showing the terminal structure in the liquid crystal display in the third embodiment of the present invention.

FIG. 5 is a top view of the liquid crystal panel of the second embodiment according to the present invention. FIG. 6 is a sectional view taken along the broken line A-B in FIG. 5 and a sectional view of a region in the display area.

Referring to FIGS. 5 and 6, a Cr/Al/Cr wire 501 made of the layer identical with that of a source-drain wire 215 of a picture element transistor formed on a display area and an ITO film constituting a transparent conductive film 103 covering the wire 501 in a terminal 101 to be connected to the external driving circuit are formed so that the wire 501 and ITO film 103 do not contact an insulating inorganic film 105 and an organic resin film 107. Namely, in the terminal 101, a terminal wire 501 made of a laminate of Cr/Al/Cr films formed of a layer identical with that of the source-drain wire 215 is brought into electrical contact with a Cr electrode wire, which constitutes a lower layer 505 made of a layer identical with that of a gate electrode 503, via a fifth opening 507 formed in an interlayer insulating film 207. A signal from the external driving circuit is thus inputted into a display panel by utilizing the wire 505 formed in a lower layer.

Figure 7A:
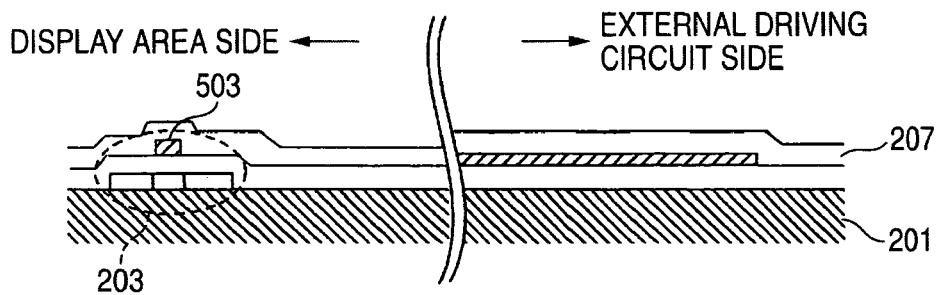
FIGS. 7A to 7C are schematic diagrams showing a flow of the manufacturing of the liquid crystal display in the third embodiment of the present invention.

A flow of the manufacturing of the liquid crystal display of this embodiment will be described. Referring to FIG. 7A, a picture element transistor 203 is formed on a glass substrate 201. During this time, a lower layer wire 505 is formed simultaneously with the formation of a gate electrode 503 of a picture element transistor made of a Cr film. After the picture element transistor 203 and lower layer wire 505 are formed, an interlayer insulating film 207 is laminated on the latter.

Figure 7B:
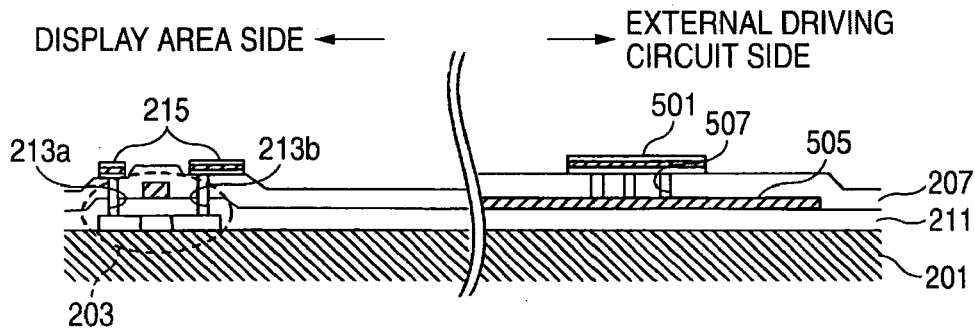

Referring to FIG. 7B, a first opening 213 is formed in the interlayer film 207 in a source-drain region of the picture element transistor 203 and gate insulating film 211, and a fifth opening 507 in the interlayer insulating film 207 on the lower layer wire 505 of the terminal 101. After the first opening 213 and fifth opening 507 are made, a source-drain wire 215 is formed so that the source-drain wire 215 communicates with the source-drain region of the picture element transistor. Simultaneously with the formation of the source-drain wire 215, a terminal wire 501 is formed so that the terminal wire 501 communicates with the lower layer wire 505 of the external driving circuit side terminal 101. Each of the source-drain wire 215 and terminal wire 501 is made of a laminated structure of Cr/Al/Cr films.

Figure 7C:
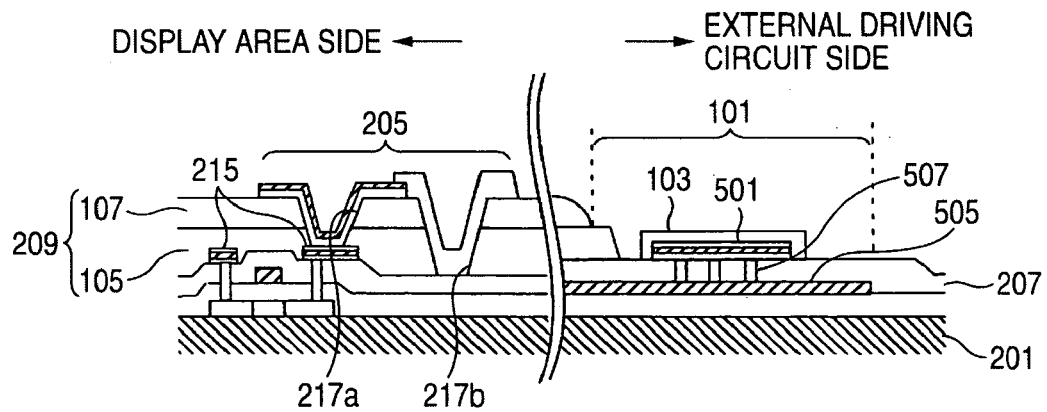

Referring to FIG. 7C, an insulating inorganic film 105 is formed in such a region of the interlayer insulating film 207 including the source-drain wire 215 that excludes the portion to become the terminal 101. The organic resin film 107 is formed on the insulating inorganic film 105, to turn the same into a protective film 209. A second opening 217a and a third opening 217b are formed in the protective film 209 by the photoengraving process. An electrode made of an Al/Cr film is formed in the second opening 217a, and a transmission electrode made of ITO on the surface of the third opening 217b to turn the same electrode into a pixel electrode 205. A transparent conductive film 103 made of ITO is formed on the terminal wire 501 in the region which is to become the terminal 101, to obtain the terminal 101. The display area side of the terminal 101 is covered with the protective film 209 formed by laminating the organic resin film 107 on the insulating inorganic film 105. The organic resin film 107 on the insulating inorganic film 105 is in a retreated state with respect to an end portion of the insulating inorganic film 105. This structure can be obtained by dry etching the insulating inorganic film 105 with a patterned organic resin film 107 used as an etching mask, and thereafter exposing the resultant product to oxygen atmospheric plasma. This structure can also be obtained even by conducting a photoengraving process two times. In the terminal 101, the terminal wire 501 is thus covered with the ITO film constituting the transparent conductive film 103, and the ITO film does not contact the insulating inorganic film 105 and organic resin film 107 on the insulating inorganic film 105.

According to the invention in the third embodiment described above, the area of the exposed portion of the terminal electrode is held down to a minimum level, and the ITO film on the signal wire avoids contacting the acrylic organic resin film 107 of a high hygroscopicity and inorganic insulating film 105, so that the signal wire is rarely exposed to the atmospheric air and rarely receives the influence of contamination of impurities. Moreover, this enables the occurrence of electrolytic corrosion ascribed to the water contained in the atmospheric air and the water contained in the acrylic organic resin film to be held down. Therefore, the imperfect electrical contact of the terminal portion ascribed to the electrolytic corrosion, and the breaking of wire of the terminal portion can be reduced. In addition, the protective film on the side of the external driving circuit is omitted, and the corrosion resistance with respect to the water is further increased. Since the wire formed in the lower layer is utilized, the area to be used for wiring can be increased.

What is claimed is:

1. A method of manufacturing a liquid crystal display, which holds a liquid crystal layer between a picture element substrate on which a pixel electrode driven by a thin film transistor is formed and a counter substrate opposed to the picture element substrate, and which forms a terminal to be connected to an external driving circuit on at least one side of the picture element substrate, the method comprising:
   forming a semiconductor layer on the substrate;
   forming a gate insulating film on the semiconductor layer;
   forming a gate electrode on the gate insulating film;
   forming a source-drain region by an ion-injecting impurity into the semiconductor layer;
   forming a source-drain wire on the substrate;
   forming a terminal wire on the substrate;
   forming insulating inorganic films on a region of the terminal wire on a side of the external driving circuit and on a region thereof on a side of a display area;
   forming an organic resin film on the insulating inorganic film; and
   forming a conductive film on the terminal wire including at least a part of the insulating inorganic film,
   wherein the conductive film has a predetermined distance to the organic resin film.

2. The method of manufacturing a liquid crystal display according to claim 1,
   wherein the conductive film is a transparent conductive film.

3. The method of manufacturing a liquid crystal display according to claim 1,
   wherein the conductive film is a laminate of a transparent conductive film and a thin metal film.

4. The method of manufacturing a liquid crystal display according to claim 1,
   wherein the forming of the terminal wire is identical with the forming the source-drain wire of the thin film transistor on the picture element substrate.

5. A method of manufacturing a liquid crystal display, which holds a liquid crystal layer between a picture element substrate on which a pixel electrode driven by a thin film transistor is formed and a counter substrate opposed to the picture element substrate, and which forms a terminal to be connected to an external driving circuit on at least one side of the picture element substrate, the method comprising:
   forming a semiconductor layer on the substrate;
   forming a gate insulating film on the semiconductor layer;
   forming a gate electrode on the gate insulating film;
   forming a first wire on the substrate;
   forming an insulating interlayer film on the first wire;
   forming in the insulating interlayer film an opening communicating with the first wire;
   filling an interior of the opening with a conductor;
   forming a second wire on the insulating interlayer film including the opening; and
   forming a transparent conductive film on the second wire,
   wherein the second wire and transparent conductive film have a predetermined distance to a protective film formed on a display area on the picture element substrate, and
   the first wire and second wire are connected together via the conductor in the opening.

6. The method of manufacturing a liquid crystal display according to claim 5,
   wherein the forming of the first wire is identical with the forming the gate electrode of the thin film transistor on the picture element substrate.

7. A liquid crystal display comprising:
   a picture element substrate on which a thin film transistor and a pixel electrode driven by the thin film transistor are formed;
   a counter substrate opposed to the picture element substrate; and
   a liquid crystal layer held between the picture element substrate and the counter substrate,
   wherein the picture element substrate is provided on at least one side thereof with a terminal to be connected to an external driving circuit,
   the terminal includes a terminal wire and a conductive film on the terminal wire,
   a surface of a region of the terminal wire on a side of the outer driving circuit and a surface of a region thereof on a side of a display panel are covered with a protective film made of a laminate of an insulating inorganic film and an organic resin film,
   the conductive film is formed on the terminal wire including at least a part of the insulating inorganic film, and
   the conductive film has a predetermined distance to the organic resin film.

8. The liquid crystal display according to claim 7,
   wherein the conductive film is made of a transparent conductive film.

9. The liquid crystal display according to claim 7,
   wherein the conductive layer is made of a laminate of a transparent conductive film and a thin metal film.

10. A liquid crystal display comprising:
    a picture element substrate on which a thin film transistor and a pixel electrode driven by the thin film transistor are formed;
    a counter substrate opposed to the picture element substrate; and
    a liquid crystal layer held between the picture element substrate and the counter substrate,
    wherein the picture element substrate includes on at least one side thereof a terminal to be connected to an external driving circuit, and a first wire to input a signal from the external driving circuit to a display panel side via the terminal,
    the terminal has a second wire and a transparent conductive film formed on the second wire,
    the transparent conductive film has a predetermined distance to a protective film formed on a display area on the picture element substrate, and
    the first wire and the second wire are connected together via an opening.

* * * * *